United States Patent [19]

Melgaard et al.

[11] Patent Number: 5,436,569

[45] Date of Patent: Jul. 25, 1995

[54] ELECTRONIC COMPONENT TESTING OVEN

[75] Inventors: Hans L. Melgaard, North Oaks; Louis A. Larson, Golden Valley; Brian E. Hajder, Crystal; Phillip G. Jordon, Roseville; Eric W. Nelson, St. Paul, all of Minn.

[73] Assignee: Despatch Industries, Inc., Minneapolis, Minn.

[21] Appl. No.: 316,562

[22] Filed: Sep. 30, 1994

Related U.S. Application Data

[63] Continuation of Ser. No. 78,905, Jun. 16, 1993, abandoned, which is a continuation of Ser. No. 591,153, Oct. 1, 1990, abandoned.

[51] Int. Cl.$^6$ ............................................. G01R 31/02
[52] U.S. Cl. .................................... 324/760; 324/73.1; 324/158.1
[58] Field of Search ................... 324/760, 73.1, 158.1; 219/209, 210

[56] References Cited

U.S. PATENT DOCUMENTS

| | | | |
|---|---|---|---|
| 2,773,731 | 12/1956 | Chick et al. | 324/158 F |
| 3,807,216 | 4/1974 | Lindwedel et al. | 73/15 |
| 4,351,108 | 9/1982 | Johnson | 324/158 F |
| 4,379,259 | 4/1983 | Varadi et al. | 324/158 F |
| 4,471,308 | 9/1984 | Gable et al. | 324/158 MG |
| 4,556,840 | 12/1985 | Russell | 324/73.1 |
| 4,692,694 | 9/1987 | Yokoi et al. | 324/158 F |
| 4,729,246 | 3/1988 | Melgaard et al. | 73/865.6 |

OTHER PUBLICATIONS

"Thermal Stress Screening-Access System," Ransco.

*Primary Examiner*—Ernest F. Karlsen
*Attorney, Agent, or Firm*—Fredrikson & Byron

[57] ABSTRACT

The present invention, in one embodiment, provides a testing apparatus for electronic components to monitor their behavior at elevated temperatures. The invention comprises a transport belt with at least one carrier attached to the transport belt, the carrier being capable of retaining an electronic component. The carriers are adapted to contact bus bars positioned adjacent the transport belt to electrically connect a component retained by the carrier to an electrical power supply. The apparatus includes means for ramping up the electrical power applied to the component from an initial low voltage to a second, testing voltage. The apparatus includes a housing defining an oven cavity through which the transport belt may pass and means providing for maintaining the ambient temperature within a portion of the cavity at an elevated temperature and other embodiment, the carrier of the present invention comprises a slot for releasably retaining an electronic component and a retaining bar movable between the first component retaining position and a second, component releasing position, the retaining bar being capable of preventing electronic components from falling out of the slots when the carrier is inverted. In other embodiment, the present invention comprises a method for testing electronic components generally comprising the steps of operatively connecting an electronic component to an electrical power source, gradually increasing power from an initial low power level to a higher testing power level, placing the component in an elevated temperature environment, monitoring the behavior of the component at the elevated temperature while supplying electrical power to the component, and disconnecting the electronic component from the electrical power source.

19 Claims, 8 Drawing Sheets

ELECTRONIC COMPONENT TESTING OVEN

This application is a continuation of application Ser. No. 08/078,905 filed Jun. 16, 1993, now abandoned, which is a continuation of Ser. No. 07/591,153 filed Oct. 01, 1990, now abandoned.

BACKGROUND OF THE INVENTION

The present invention generally relates to an apparatus for testing electronic components. The apparatus is particularly adapted for testing electronic components useful in high temperature environments.

Engineers are continually finding new applications for electronic components. Increasingly, these applications require electronics to operate under demanding environmental conditions, such as elevated temperatures. For instance, automobiles frequently utilize electronic circuits to monitor or control a number of the operating parameters of the engine, as in the case of electronic ignition systems. These circuits are generally located under the hood of the vehicle adjacent the engine where the ambient temperature can be rather high, often exceeding 100° C. If such a component were to fail under operating conditions, it may well render the entire vehicle inoperable.

In order to increase the reliability of products incorporating such components, electronic systems are frequently tested as part of a quality control program before they are installed. The testing may be performed on each component or only on a representative sample of a larger batch of components to estimate the overall quality of the batch. The former approach is preferred because any component which fails the test can be eliminated, preventing the incorporation of a faulty component into the finished product. However, this extensive quality testing can be unduly expensive to carry out. In order to test components which will be placed in elevated temperature environments, it is necessary to test the components at high temperatures, such as in an oven, to simulate actual operating conditions. Providing such an environment can significantly add to the cost of a quality control program. Accordingly, it would be useful to have an efficient, economical process for testing a large number of electronic components at elevated temperatures.

Currently, an elongate oven having an electrical power supply is utilized to test electronic components, with the oven providing an elevated temperature environment in which the testing is carried out. The components are commonly placed on a generally horizontal conveyor belt or the like for transportation through the oven and are supplied with electricity as they are transported. In order to ensure a dwell time in the oven sufficient to heat the component to the desired temperature and monitor its behavior at that temperature, the ovens tend to be long and flat, taking up a great deal of valuable floor space in a factory.

The loading and unloading of the components from the conveyor system commonly takes place outside of the heated environment of the oven. The components remain on a portion of the conveyor which extends past the end of the oven until they have been cooled by the ambient air sufficiently to allow them to be removed. Not only does this further increase the floor space required for the system, but it also decreases the efficiency of the oven because the heat radiated by the components as they cool is lost to the environment. Additionally, the components will experience thermal shock as they enter and exit the heated oven unless intermediate temperature zones, commonly requiring separate control equipment, are provided at each end of the oven.

As noted above, electricity is applied to the component as it passes through the oven. The component usually is attached to an electrical connector which is connected to a power supply. The electrical connector may be continuously supplied with electricity or it may be hooked up to the power supply after the component is attached. In either instance, the component suddenly goes from an initial condition without any power to a condition wherein full power is applied. This occurs when the component is attached to the connector if the conveyor is constantly charged, whereas if the electricity is supplied to the connector after attachment of the component, the power surge occurs when the connector communicates with the power source. This sudden change in power level can result in rather sharp voltage spikes across the circuitry of the component, possibly damaging the circuit. Similarly, a sudden drop in power occurs when the component has completed the testing, either when the component is removed or when the power supply to the connector is terminated. Since this power drop also may harm the circuit, a faulty component may be installed because it has already passed the quality test and is presumed to be reliable.

The electrical supply system in these ovens commonly comprises a pair of long wires or bus bars, with one being positively charged and the other being negatively charged, which contact the electrical connector as it proceeds along the oven with the component. The wires generally extend along substantially the entire length of the oven and are connected to a single power source. If the power source or either of the wires fail, electricity cannot be supplied to the component for testing. This precludes the performance of any quality checks, resulting in the inability to even spot check a batch of components unless a lower capacity back-up testing oven is supplied; thus, faulty components may go undetected.

Accordingly, it would be desirable to have a compact, efficient electronic component testing oven which minimizes thermal shock to the components. It would also be desirable to provide such an oven with an electrical supply which avoids sharp power surges applied to the components and is provided with a back-up system to increase reliability and minimize down time due to failure of a part of the electrical system.

SUMMARY OF THE INVENTION

The present invention provides an apparatus for testing electronic components having an oven cavity through which the components pass. A portion of the oven cavity defines a hot zone maintained at an elevated temperature and the components are loaded into and unloaded from the apparatus in a cooling zone which is at a lower temperature. The hot zone is desirably located generally above the cool zone, permitting the heated air produced as the components cool to rise into the heating zone. A buffer zone having a temperature intermediate the heating and cooling zones is disposed between these two zones to minimize thermal shock. In a preferred embodiment, the loading and unloading of components are performed adjacent one another in a single cool zone, thereby reducing the floor space required by the apparatus.

Electrical bus bars extend along most of the length of the oven and provide electricity to the components being tested. Oppositely charged bus bars are provided on either side of a movable transport belt along which the components travel. In a 'Direct Current' electrical system, the bus bars on one side may carry a relative positive charge while the bus bars on the other side carry a relative negative charge. In an 'Alternating Current' electrical system, the charge on the bus bars on either side of the belt will alternate between a positive and a negative charge, but the bus bars on one side will carry a charge opposite that of the bus bars on the other side.

Desirably, each side includes a pair of parallel bus bars at substantially the same voltage. If one of the paired bus bars fails, the other bus bar will continue to deliver power, permitting testing to continue and reducing down time of the apparatus. In a preferred embodiment, electrical leads are provided at each end of the testing path, i.e., adjacent the loading and unloading stations.

In a preferred embodiment, the electrical bus bars are divided into a plurality of individual sections rather than having a single set of bus bars extend throughout the length of the oven. Separately powered electrical isolators are disposed between adjacent sections of the bus bar to ensure that a continuous power supply is available to the component to be tested, yet permitting bus bar sections to be electrically independent of one another.

The component to be tested is plugged into a carrier which is mounted on the transport belt for movement therewith through the oven. The carrier includes electrical contact means which provide electrical connection between the bus bars or electrical leads and the component on the carrier. Once the component is connected to the carrier, the voltage across the electrical leads adjacent the loading station is ramped up from an initial low voltage, such as zero, to a higher testing voltage. The carrier is then moved along the oven and the contact means engages the electrical bus bars before the connection with the electrical leads is terminated. Since the testing voltage of the leads is substantially equal to the voltage across the bus bars, the components do not experience any sharp increase in power at this junction. The contact means remain in operative connection with the bus bars until the carrier reaches the end of the testing path, at which point the contact means electrically contacts the electrical lead adjacent the unloading station. The potential across this electrical lead is then ramped down to a low voltage, such as zero, before the connection between the contact means and the electrical lead is terminated. This electrical system ensures that adequate power is supplied to the components being tested throughout the length of the oven without having any deleterious power surges or sharp power drops across the component.

DETAILED DESCRIPTION OF THE PREFERRED EMBODIMENTS

Figure 1:
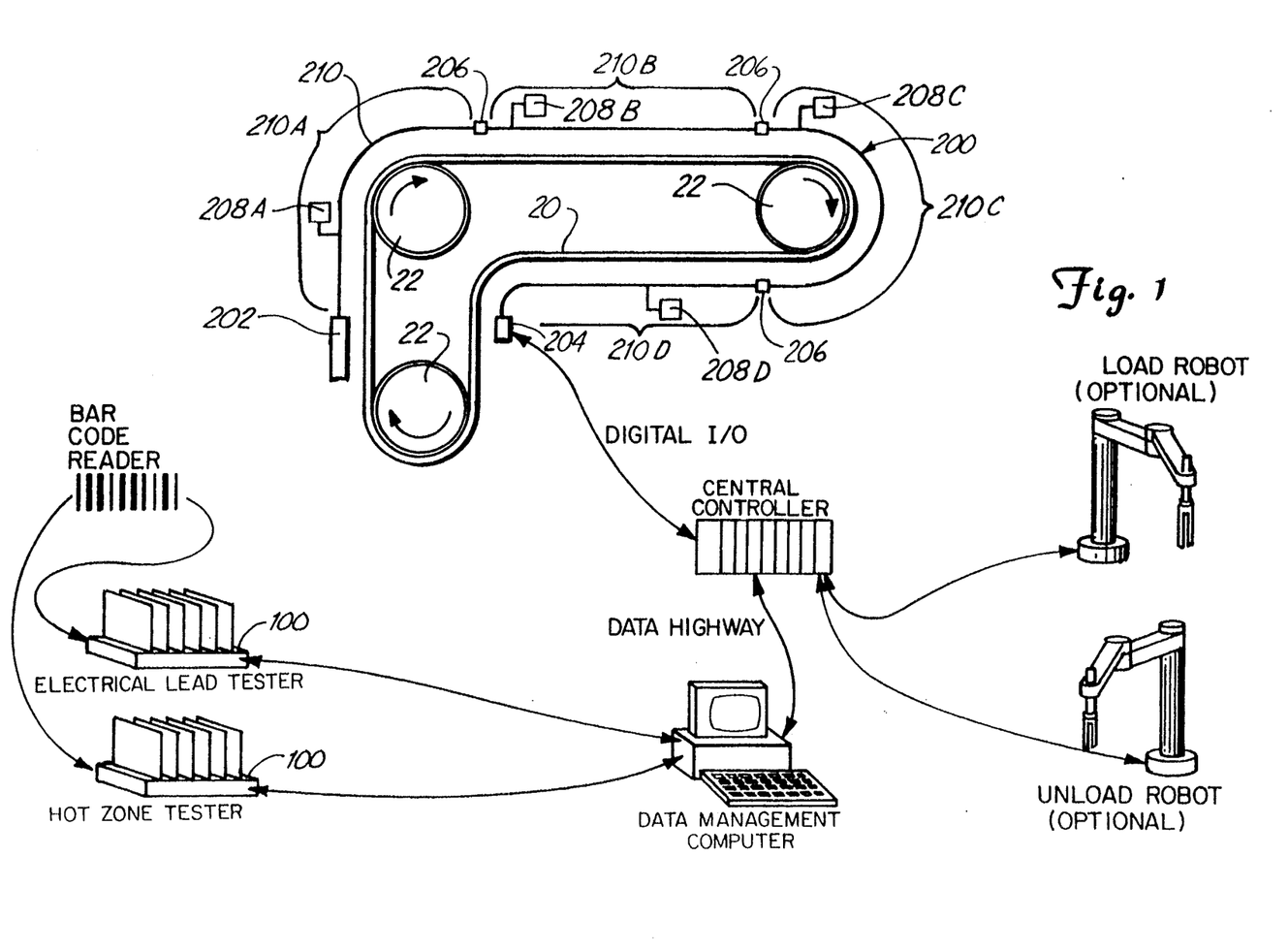
FIG. 1 is a schematic diagram of an electronic component testing apparatus of the present invention.

A schematic diagram of the preferred embodiment of the present invention is shown in FIG. 1. The apparatus includes a transport belt 20 supported by a plurality of rollers 22 within an oven cavity. (The housing defining the oven cavity has been eliminated from this schematic for purposes of clarity; the construction of the oven is discussed in detail in reference to FIG. 3.) A plurality of electronic components are carried by the transport belt 20 through a heated portion of the oven cavity for testing at an elevated temperature. Power delivery means 200 are also provided in the oven cavity at a position adjacent the transport belt for supplying electrical power to the components. The power delivery means comprises a pair of electrically powered bus bars 210, with one bus bar being disposed adjacent each side of the transport belt and extending alongside the transport belt along most of its length.

In a preferred embodiment, the power delivery means 200 includes a first pair of electrical leads 202, with one lead being positioned adjacent a first end of each of the paired bus bars. After at least one component has been loaded onto a carrier 100 (discussed in detail below) on the transport belt and the carrier is brought into electrical contact with leads 202, power is supplied to the leads 202. As explained below in reference to FIG. 2, power is then supplied to the lead in a relatively gradual fashion to ramp up the potential across the pair of leads 202 from an initial low voltage to a higher voltage for testing. The initial voltage is desirably approximately zero and the higher testing voltage is desirably substantially equal to the voltage across the pair of bus bars 10. This ramping of power minimizes the effects of voltage spikes on the components on the carrier 100, which would be much more prominent if the power were supplied to the components more abruptly. Similarly, a second pair of electrical leads 204 may be provided for ramping down the power, with one lead 204 being positioned adjacent the other end of each bus bar 210. The voltage across this set of leads 204 is decreased from an initial higher voltage, which may be substantially equal to the voltage across the bus bars, to a final lower voltage, which is preferably approximately zero.

Figure 5:
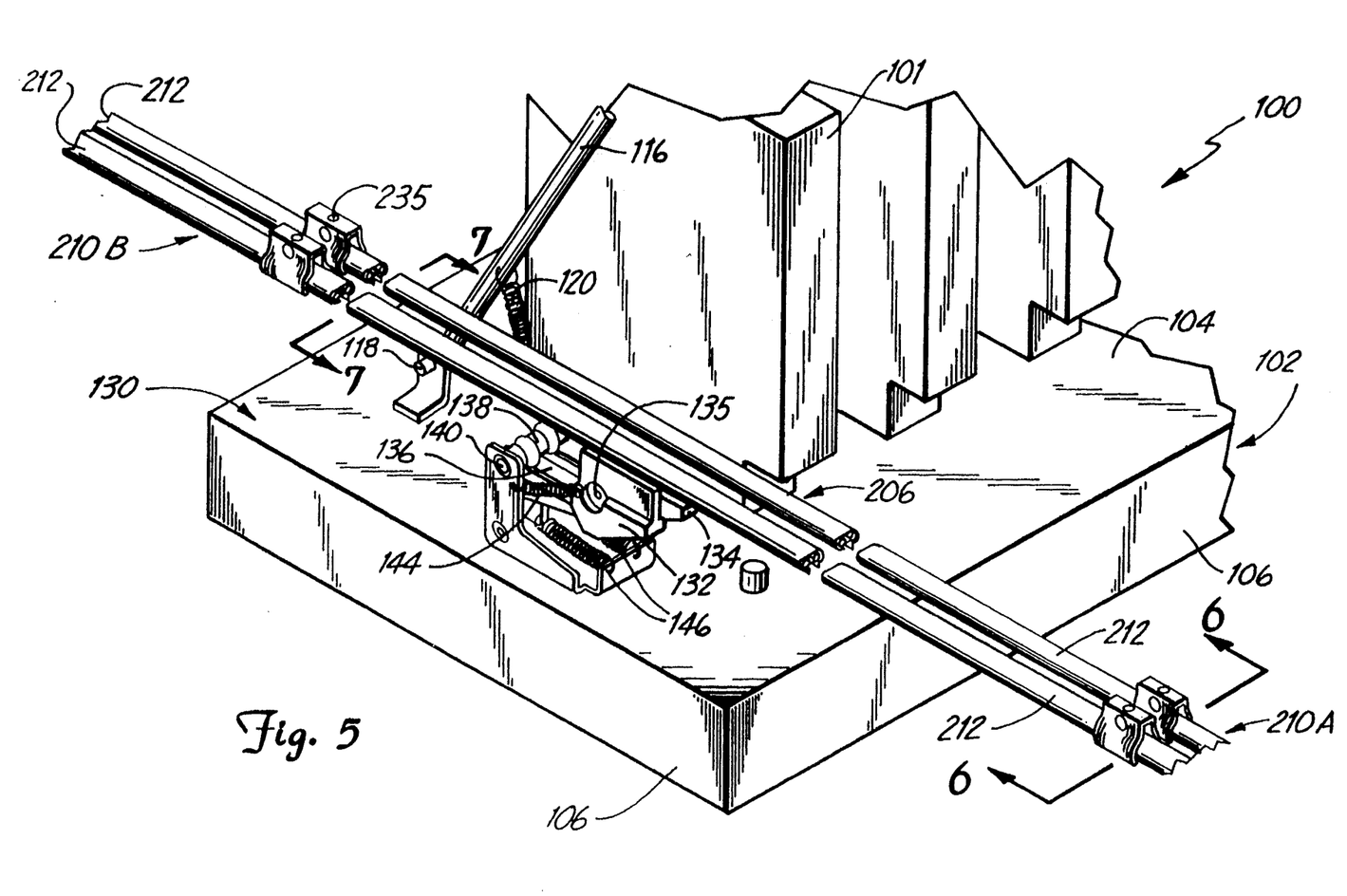
FIG. 5 is a broken-away view of a portion of the carrier of FIG. 3 showing the relation to the electrical bus bars and an isolator section.

A single pair of bus bars 210 may extend along the entire length of the power delivery means 200. However, in a preferred embodiment, the bus bar 210 is divided into at least two separate segments; in a particularly preferred embodiment of the invention, the bus bar comprises four such segments 210A–D. Isolator sections 206 are desirably provided between each of these segments. These isolators 206 provide a bridge from one bus bar segment, e.g., 210A, to an adjacent segment, e.g., 210B, in such a manner as to prevent the carriers 100 from electrically connecting one segment to another as they proceed along the path of the transport belt 20. This ensures that each of the bus bar segments remains electrically independent of the other segments. The isolators desirably comprise a pair of substantially electrically conductive members, with one such member being disposed between adjacent ends of each of the paired bus bars in two adjacent segments. The configuration of a preferred embodiment of such an isolator is shown in FIG. 5 and discussed more fully below.

Figure 2:
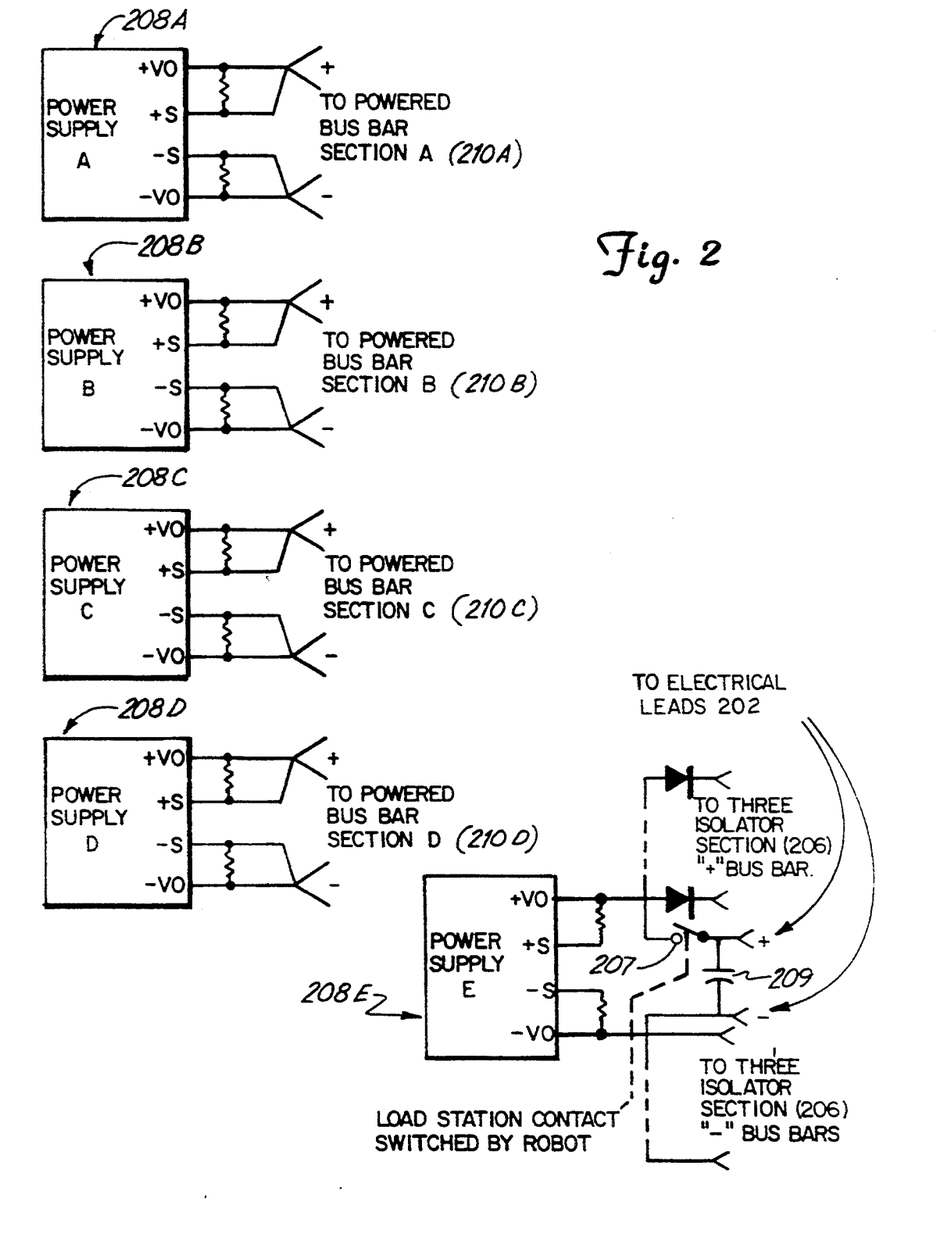
FIG. 2 is a schematic electrical diagram of the power supply system of a preferred embodiment of the invention.

A single power supply 208 may be utilized to drive the entire power delivery system, but a number of separate power supplies 208A–208D are preferred. In particular, it is desirable to utilize a different power supply for each of the bus bar segments 210A–D and for the isolators 206, as shown in FIG. 2. Each of four power supplies 208A–208D are electrically connected to a different one of the bus bar sections 210A–D. The power supply delivers a relative positive charge to one of the paired bus bars and a relative negative charge to the other of the bus bars, creating an electrical potential across the bus bars. The relative negative charge need not actually be maintained at a negative voltage so long as the voltages applied to the bus bars differ sufficiently to produce the desired testing voltage. For instance, if a voltage of 16 v is desired, a relatively positively charged bus bar may be maintained at 16 v while the relatively negatively charged bus bar is held at 0 v.

The isolators 206 may all be connected to a single power supply 208E as shown (not shown in FIG. 1), with one of the electrically conductive members carrying a relative positive charge and the other a relative negative charge, much like the bus bars 210. If desired, the same power supply 208E may also provide power to the first 202 and second 204 electrical leads. FIG. 2 shows schematically how the first electrical lead 202 may be connected to the power supply 208E. An electrical switch is disposed between the power supply and one of the paired electrical leads 202 and a capacitor is connected between the two leads. Alternatively, the capacitor 209 may be disposed between the switch 207 and a single one of the leads. The switch may be opened and closed by any known means, including manual operation. However, if automated means, such as a robot, are utilized to load the components as described below, these means may operate the switch.

When the switch 207 is closed to provide power to the carrier 100, the potential across the electrical lead does not suddenly jump from zero to a higher voltage. Instead, the capacitor 209 limits the rate at which the potential increases. This rate does not have to be particularly slow; a time delay of less than a second between the low and high voltage levels will prevent any significant voltage spikes in the components in most applications. Although FIG. 2 only shows the first pair of electrical leads 202 connected to power supply 208E, the second pair of leads 204 may also be connected thereto in similar fashion.

Providing the power delivery means 200 with a plurality of independently powered and electrically isolated bus bar segments 210A–D, rather than a single bus bar extending the entire length of the power delivery means, is advantageous in the present invention for several reasons. For instance, the power demand of the system is divided among several power supplies, eliminating the need for a single, very high capacity power supply. This in turn permits the use of less expensive bus bars because the bus bar segments only have to handle a fraction of the total current required by the system; if a single, long bus bar were used, the bus bar would have to be capable of delivering the entire current supply to the oven without failure. Also, if one of the power supplies fails, one or more of the other power supplies may provide power to the section connected to the failed supply, minimizing down time of the testing apparatus for repairs.

As shown in the schematic of FIG. 1, the apparatus of the invention may, if desired, be automated to a large extent. The system may include a computerized central controller which monitors the status of the system and controls its operation. Information regarding the status of the power delivery means 200 may be communicated to the central controller as digital information, as may signals for controlling the power delivery means. For instance, the central controller may be used to control the power delivered by each of the power supplies 208A–E to maintain the power delivered to each of the delivery means' elements at substantially the same level. Automated means, such as robots, may optionally be used for loading and/or unloading each of the components into and out of the carriers of the apparatus. Such automated means will eliminate the necessity of human operators for this function, eliminating a menial, boring task as well as decreasing operating costs.

As the components proceed through the oven cavity, their behavior must be monitored to detect components which fail. This may be done on a continuous basis, or they may be tested at selected sites along their path. As explained in respect to FIGS. 8 and 9, a tester may be connected to a carrier 100 for a time to determine the status of the components on the carrier, and then be disconnected for connection to the next carrier. Such a tester is advantageously applied at at least two sites—adjacent the first electrical lead 202 and within the hot zone of the oven cavity (36 in FIG. 3). A tester adjacent the first electrical lead can monitor the condition of the components before they enter the oven and, if so desired, unsatisfactory components may be replaced with other components before the carrier begins its passage through the oven. The hot zone tester can detect deviations of a component from normal operating behavior at elevated temperatures such as those the components will experience in use in a final product.

Information derived during this testing can be communicated directly to the central controller or, preferably, to a separate data management computer. Such a separate computer, which may be a relatively inexpensive personal computer or the like, can reduce demands on the central controller while effectively processing test data. If failure of a component to meet established normal parameters is detected, this fact may then be communicated from the data management computer to the central computer. In order to accurately pinpoint which component out of all of the components in the oven has failed, it is useful to identify the carrier containing the defective piece. In order to allow faulty carriers to be exchanged with working ones without disrupting this identification process, each carrier may carry its own identification and means for discerning this identification may be incorporated in the system. In a preferred embodiment shown in FIG. 9 and explained below, the identification is electrically encoded and may be detected by the tester.

In order to locate a particular faulty component after the testing procedure is complete, it may be desirable to provide each component with a separate identifying number, not unlike the carrier identification system. As shown in FIG. 1, this may be bar code-based, with each component having a unique bar code. A bar code reader may read the bar code imprinted on each component before it is loaded onto a carrier, and the position of each component on the carriers and the carrier's identification may be noted upon loading. When the system indicates that a component is unacceptable, its position on an identified carrier may be used to determine the identifying number of that particular component. A second bar code reader, which may be placed along a conveyor belt transporting components from the oven to the production line of a factory, may then scan each component's bar code and remove the unacceptable components from the stream of components delivered for production.

Figure 3:
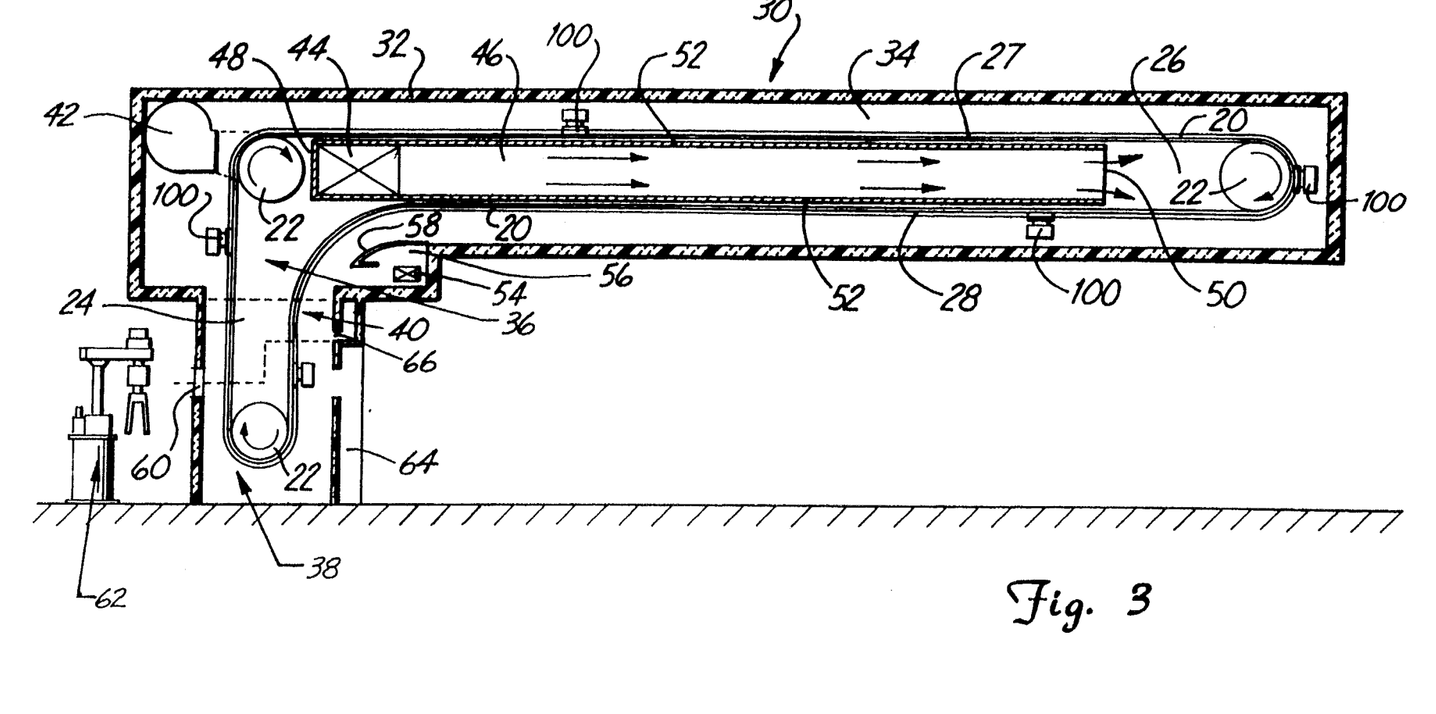
FIG. 3 is a cross-sectional view of a testing oven of the present invention.

Referring to FIG. 3, it can be seen that the transport belt 20 and the rollers 22 referred to above are contained within an oven 30. In a preferred embodiment, the transport belt travels along a generally L-shaped circuit having a lower cooling leg 24 and an upper heating leg 26. The heating leg has an upper portion 27 and a lower portion 28. The transport belt may be of any desired construction such as a conventional flat, flexible conveyor belt. In a preferred embodiment, though, the transport belt comprises a pair of substantially parallel chains which extend along the path shown in FIG. 3 being spaced from one another in a plane perpendicular to the plane of FIG. 3. Although only three rollers are shown in this figure, the transport belt is desirably supported by a plurality of rollers which define the path along which the belt travels, as is known in the art. Desirably, at least one of the rollers 22 is operably connected to a motor which causes the roller to rotate in the direction indicated by the arrows in the drawing. This drive roller in turn drives the transport belt through the oven chamber in a generally clockwise direction. In the preferred embodiment set forth above, wherein the transport belt comprises a pair of chains, the drive roller may include gear teeth adapted to engage the chains, ensuring proper traction between the chains and the roller.

The oven 30 comprises a housing 32 defining an oven cavity 34 therein. The oven cavity 34 may be considered as having three different functional areas—a hot zone 36, a cool zone 38, and a buffer zone 40. In a preferred embodiment, the hot zone is an elongate, substantially horizontal space which encloses the heating leg 26 of the transport belt. Desirably, the hot zone is substantially longer than the other zones, permitting a greater proportion of the path of the transport belt 20 to be along the heating leg 26 to maintain the components at an elevated temperature for a longer period of time.

The heating zone 36 is desirably positioned generally above the cool zone 38. This provides numerous advantages, including both a substantial saving of floor space and increased heating efficiency. More efficient heating is provided by this construction because the heat which is given off by the objects as they cool in the cool zone rises upwardly into the hot zone rather than being lost to the ambient atmosphere. Although in the embodiment depicted in FIG. 3 the oven is generally L-shaped, with the cool zone being disposed adjacent one end of the hot zone, it is to be understood that this particular construction is not necessary. The same results may be achieved if, for example, the cool zone is horizontally displaced from the position as shown in FIG. 3, such as by positioning the cool zone substantially beneath the center of the hot zone, yielding a generally T-shaped structure.

The hot zone is maintained at an elevated temperature. This temperature may be substantially the same as the average temperature of the environment in which the component will be installed. For example, if one utilizes the apparatus of the invention to test electronic components which will be located under the hood of a vehicle generally adjacent the engine, a temperature in the neighborhood of 100° C. may be chosen. These elevated temperatures may be provided by any means which are known in the art.

In the preferred embodiment depicted in FIG. 3, though, the oven includes a recirculation fan 42. This fan may be located within a portion of the hot zone, as shown, or it may instead be located generally externally of the oven, as desired. The air supplied by this fan 42 may be heated by any known means, such as by providing heating elements (not shown) within the path of the air exiting the fan.

Hot air from the recirculation fan 42 is delivered to a hot air supply plenum 46 via a conduit 44. The hot air supply plenum may have a first end positioned toward the end of the hot zone 36 adjacent the cool zone 38. This first end 48 is sealed and the heated air from the recirculation fan 42 flows generally away from this first end toward the second end 50 of the plenum in the general direction indicated by the arrows in FIG. 3. Although the plenum 46 may be of any desired construction, it is desirably generally rectangular in cross section having a pair of horizontal plate members 52. These plate members 52 may be positioned generally adjacent the upper and lower portions (27 and 28, respectively) of the transport belt's heating leg 26 and be generally parallel to both of these portions of the heating leg as well as to each other.

Figure 4:
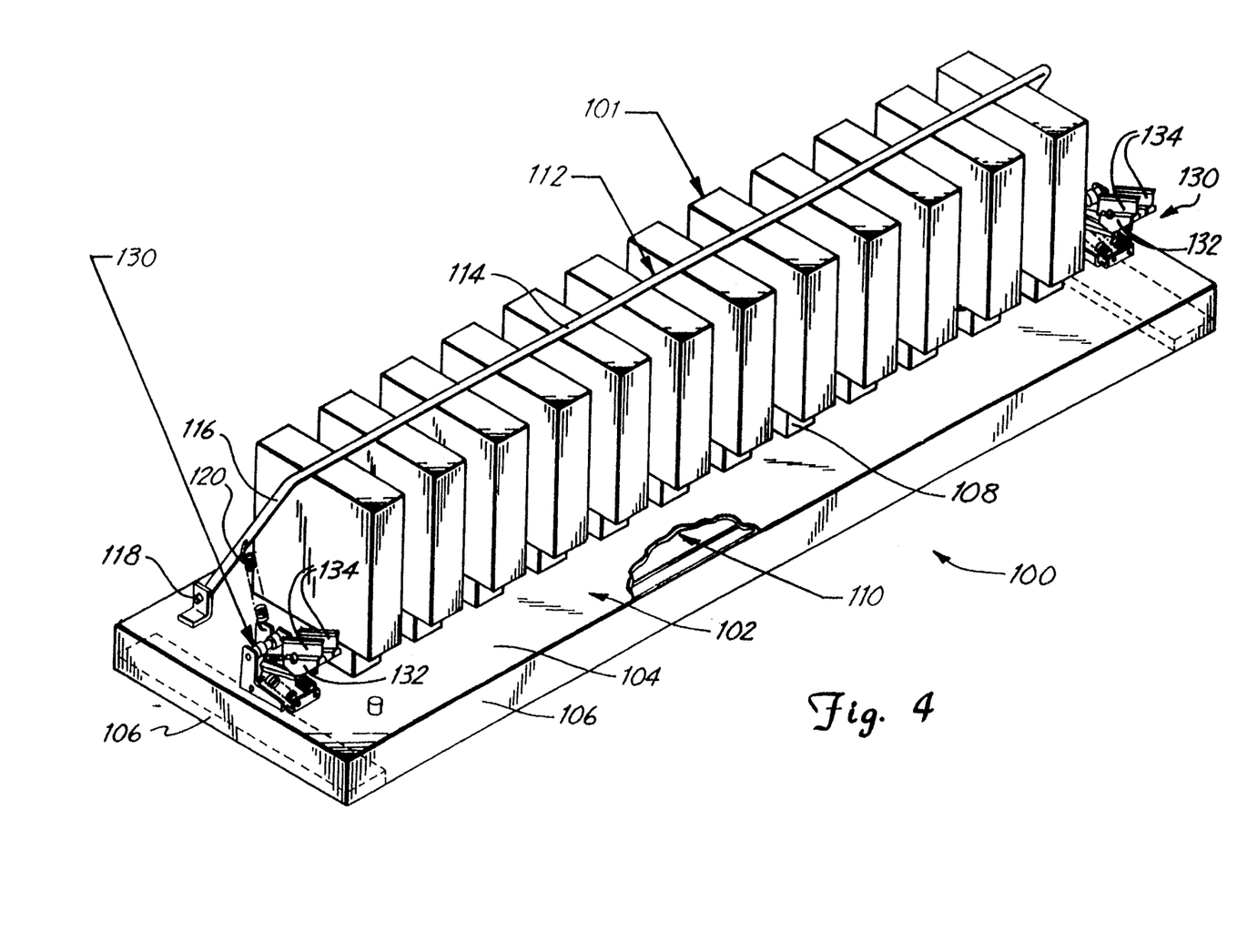
FIG. 4 is a partially broken-away perspective view of a carrier of the invention showing a plurality of electrical components connected thereto.

The second end 50 of the supply plenum 46 is desirably spaced away from the end of the hot zone 36. This permits air delivered through the supply plenum 46 to pass upwardly through the upper portion 27 and downwardly through the lower portion 28 of the transport belt's heating leg 26 as indicated by arrows in FIG. 3. The continued delivery of heated air through the supply plenum 46 urges air to circulate back toward the opposite end of the hot zone externally of the supply plenum, which is also indicated by arrows in FIG. 3. This air passes directly over the loaded component carriers 100 to heat the components for testing. (Only a few, representative component carriers are depicted in FIG. 3; the component carriers will be discussed in detail with regard to FIG. 4.) The heated air may be directed back to the recirculation fan 42 through a hot air return duct 54.

As noted above, the cool zone 38 is desirably positioned generally below the hot zone 36. A portion of the cooling leg 24 of the transport belt's path extends through the cool zone 38. The cool zone 38 includes a component access port 60 through which components may be loaded onto or unloaded from the component carriers 100. If one desires to utilize mechanical means, such as a robot 62, to load or unload the components, the robot 62 or other mechanical means is desirably placed adjacent this port so that it may readily access the carriers attached to the transport belt. It is to be understood that if more than one robot is to be utilized, as outlined above in the discussion of FIG. 1, it may be desirable to include more than one such component access port 60.

The supply of cool air for the cool zone 38 may, if desired, simply comprise the ambient air which enters through the component access port 60. In a preferred embodiment, however, the cool zone is maintained at a lower temperature by a cool air supply means 64. Any known means of supplying air cooler than that in the hot zone may be employed in the cool air supply means 64, but a particularly preferred embodiment utilizes chilled water. Water maintained at a reduced temperature, desirably between about 5° and 15° C., is passed through a plurality of tubes (not shown) which are in contact with air from the oven cavity 34. These cooling tubes may be installed within a recess 66 positioned on the side of the cool zone 38 opposite the component access port at a position slightly higher than that port. The air entering the chamber 66 will be cooled by the chilled water, increasing the density of the air. This denser air would then flow generally downwardly out of the chamber 66 and around the bottom portion of the cooling leg 24 of the transport belt's path. If so desired, the cool air supply means 64 may be provided with a recirculation fan (not shown) which will draw cooled air from a position within the cool zone 38 back up into the chamber 66 to increase the efficiency of the cooling process.

A buffer zone 40 is located generally between the hot zone 36 and the cool zone 38. Although it is shown schematically in FIG. 3 by distinct phantom lines, it is to be understood that the edges of the buffer zone are not so clearly defined. This zone is created essentially by turbulent intermixing of air from the cool zone and the hot zone, precluding such a clear demarcation between the various zones.

As noted above, the hot zone may include a hot air return duct 54 to recirculate heated air. In the embodiment shown in FIG. 3, the inlet for the duct 54 is located in a recess 56 within the hot zone. Desirably, the recess is defined on two sides by portions of the housing 32 and on its upper side by a shield 58 which limits the direction of air flow toward the duct 54. The shield 58 is desirably generally parallel to the path of the transport belt 20 and includes a generally inwardly extending flange. In this manner, air will be drawn from the bottom portion of the hot zone generally horizontally into the recess 56. This increases turbulence of the air above the cool zone 38, causing air from the hot zone 36 and the cool zone 38 to mix, producing a temperature within the buffer zone intermediate the relative extremes of the hot and cool zones.

Furthermore, it should be clear that the temperature will change relatively gradually between the lower end of the buffer zone adjacent the cool zone 38 and the upper end of the buffer zone adjacent the hot zone 36. As components travel along the transport belt, they pass through the buffer zone when moving from the cool zone to the hot zone, or vice versa. The buffer zone allows a relatively gradual increase or decrease in the temperature of the environment surrounding the components on the component carrier 100. This gradual change greatly reduces thermal shock to the components during the testing process.

The transport belt 20 of the apparatus desirably includes a plurality of component carriers 100 spaced along its length. The number of carriers and the length of time which it takes to load and unload components from each carrier may determine the dwell time of the components within the oven. As each of the carriers is loaded and ramped up to testing voltage as described above, the entire transport belt is advanced to place the next carrier into position for loading. As one increases the number of carriers attached to the transport belt, one increases the time it will take the components to complete the testing path due to the time it takes to load and unload the components from each of the carriers.

Although the carriers may be attached to the transport belt by any suitable means, it is desirable to permit some freedom of movement about this attachment to minimize stress on the attachment as the transport belt curves about the rollers (22 in FIG. 3). For instance, in the preferred embodiment noted above wherein the transport belt Comprises a pair of substantially parallel chains, the carrier may be affixed to a single link of each of the chains and the link may pivot with respect to adjacent links as the chain proceeds around the rollers 22.

A component carrier of the invention, generally designated as 100, is shown in FIG. 3 with a plurality of electronic components 101 attached thereto. The carrier 100 includes a base 102 which may comprise an upper member 104 having side walls 106 which extend downwardly along the periphery of the upper member 104 and may be substantially perpendicular thereto. The base 102 desirably includes a plurality of slots 108, with each slot being designed to receive and releasably retain a single component 101. The slot 108 desirably includes means for electrically connecting each of the components to the rest of the carrier. For instance, if the electronic component includes a plug designed to mate with a connector in the finished product, the slots 108 may be configured to retain the plugs of the components in the same manner as will the final product.

As the carriers travel along the path of the transport belt, the components 101 may have a tendency to slip out of their respective slots 108. In a conventional electric component testing oven wherein components are not included on the return side of the-transport means, the components remain substantially horizontal. Loose components generally do not present any substantial difficulties in these designs. The preferred embodiment of the invention shown in FIG. 3 greatly reduces both floor space and overall space requirements for the electronic component testing oven by utilizing virtually the entire path of the transport belt for testing purposes. However, the design shown in FIG. 3 also tends to increase the possibility of a component falling out of the carrier during testing. This possibility is at its greatest when the carrier is completely inverted as it travels along the lower portion 28 of the heating leg 26 of the transport belt's path (see FIG. 3).

To prevent the components from becoming dislodged from their respective slots, the carrier 100 may also be provided with a retaining bar 112. The retaining bar is desirably generally U-shaped, having an elongate rod 114 and one strut 116 at each end thereof. The rod 114 is desirably adapted to contact a portion of each component 101 disposed away from the base 102 of the carrier. The retaining bar is desirably pivotally mounted to the base 102 of the carrier, such as by a pin 118, and biased toward the position shown in FIG. 4 wherein it engages the electronic components, such as by spring 120. This pivotal attachment permits the retaining bar to be moved to a position disposed away from the electronic components when the components are being loaded into or unloaded from the carrier.

The carrier is also provided with contact means 130 for electrically contacting the bus bars discussed above in connection with FIG. 1. In the preferred embodiment of the present invention, each carrier includes a pair of such contact means, with one being disposed adjacent each end of the base 102 of the carrier. Care should be taken to ensure that the space between the bus bars is substantially the same as the space between the contact means 130 to ensure proper contact therebetween.

Figure 6:
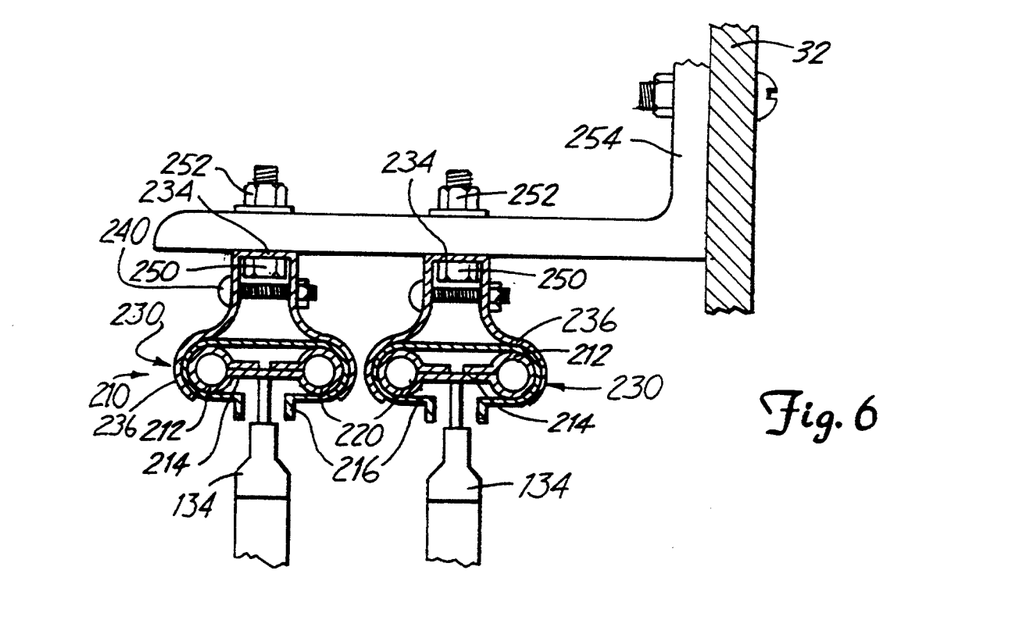
FIG. 6 is a cross-sectional view of a preferred embodiment of the electrical bus bars of the invention.
Figure 7:
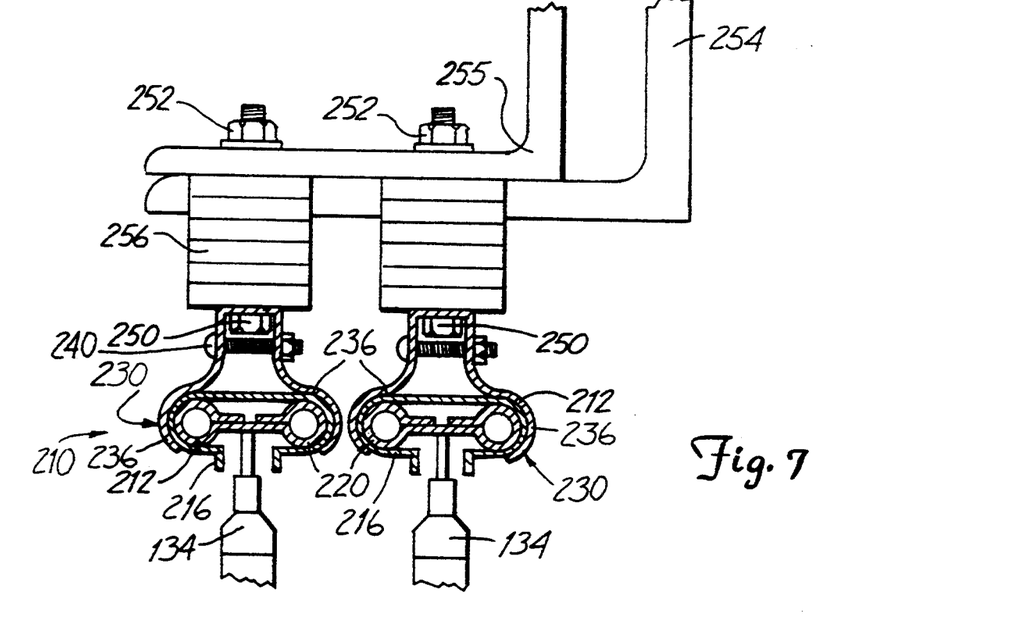
FIG. 7 is a cross-sectional view similar to FIG. 6 showing a preferred embodiment of an isolator section.

The contact means 130 and bus bar 210 used in the present invention may be of any desired construction which ensures that the requisite power will be delivered to the carrier for testing the components. A preferred embodiment of these elements of the invention, however, is shown in detail in FIGS. 5-8. In this embodiment, the contact means 130 includes a brush 132 which electrically contacts the bus bar 210. The brush 132 desirably comprises a pair of generally upwardly extending fingers 134, each of which is pivotally attached to a generally forwardly extending arm 136 about a finger pivot 133. Each of the fingers contacts an individual conductor 212 of the bus bar 210, as shown in FIGS. 6 and 7 and discussed in more detail below. Both arms are desirably affixed to a pivot cylinder 138 which is pivotally retained about a pivot pin 140. The pivot pin 140 may be attached at both ends to a mounting bracket 142 affixed to the upper member 104 of the carrier base.

A pair of springs may be provided with one end attached to the mounting member 142 and the opposite end attached to one of the fingers 134 to rotatably bias the finger about the finger pivot 135 in a generally counterclockwise direction in FIG. 5. Similarly, a lower spring 146 may be attached to each of the arms 136 at a position disposed radially outwardly of the pivot cylinder 138. The other end of lower spring 146 may be attached to the mounting bracket 142 at a position disposed generally rearwardly of the pivot cylinder 138. This will tend to urge the arms 136 generally clockwise about the pivot pin 140. The lower springs 146 thus tend to urge the fingers 134 upwardly into electrical contact with the bus bar 210.

As mentioned above in connection with FIG. 1, an apparatus of the invention desirably includes a pair of bus bars 210, with one being disposed adjacent each side of the transport belt 20 along most of its length. These bus bars are used to deliver electrical power from the power supplies (208 in FIG. 1) to the components 101 being tested. One of the paired bus bars is provided with a relative positive charge while the other carries a relatively negative charge.

Although any means known in the art may be used to deliver electrical power to the components, a bus bar 210 of the invention desirably comprises a pair of substantially parallel conductors 212 which are positioned adjacent one another on the same general side of the carriers 100. Any design of the conductors 212 which provides good electrical contact with the brush 132 of the carrier's contact means 130 may be used. A preferred embodiment, however, is shown in FIGS. 5-7.

In this preferred embodiment each conductor 212 comprises an inner conducting strip 214 and a generally insulating cover 216, as best seen in FIGS. 6 and 7. The conducting strip 214 desirably includes a generally flat contact surface which may be electrically contacted by the fingers 134 of the contact means 130. The conducting strip may also include rounded end members 220. The entire conducting strip 214 may be formed of a single elongate, flat conducting material, such as copper, which has been folded into the shape shown. The cover 216 may engage the rounded end members 220 of the conducting strip to hold the strip in a fixed position within the cover. The cover 216 preferably encircles substantially the entire conducting strip, but includes a slot through which the fingers 134 of the contact means may reach the conducting strip 214. This slot extends along the length conductor 212 and may include a pair of flanges which define the slot. These flanges desirably extend generally away from the conducting strip 214, and serve to guide the fingers 134 of the contact means as they slide along the length of the conductors 212. Conductors 212 such as those described are commercially available from DUCT-O-WIRE COMPANY under the trademark DUCT-O-BAR.

The conductors 212 may be held in place in the oven cavity 34, and with respect to one another, by a plurality of clamps 230. The clamps preferably comprise a generally horizontal top member 234 with a leg 236 depending from either side. Each leg 236 of the upper portion may be provided with an aperture for receiving a bolt 240. The portion of each leg disposed away from the top member 234 is desirably curved to engage a side of the cover 216 of the conductor. By tightening a nut threaded onto the bolt 240, these curved portions of the legs may be urged against the sides of the cover 216 and hold the cover in a fixed position.

The top member 234 of the clamp 230 may include an aperture 235 for receiving a mounting bolt 250. The mounting bolt extends generally upwardly away from the conductor 212 and is affixed to a bracket 254 by means of a nut 252 or the like. The bracket 254 is held in place adjacent the transport belt, such as by being bolted to the housing 32 of the oven.

FIGS. 6 and 7 depict two alternative embodiments of the present invention. In the embodiment shown in FIG. 6, the clamps 230 holding the conductors 212 are mounted directly to the bracket 254. As shown in FIG. 7, however, a plurality of washers 256 may be disposed between the clamp 230 and the bracket 255, which is attached to bracket 254, which may in turn be attached to the housing 32 of the oven (not shown). Although either embodiment will suffice, the embodiment shown in FIG. 7 permits the distance between the bracket 254 and the contact surface 218 of the conducting strip 214 to be varied. This in turn permits the relative positions of the contact surface 218 and the transport belt 20 to be adjusted precisely to remain substantially constant along the length of the transport belt to ensure proper contact between the contact surface 218 and the fingers 134 of the contact means of the carriers.

It may be desirable to incorporate both embodiments in a single oven. For instance, the embodiment of FIG. 6 may be utilized for positioning the bus bar segments 210A-D, while the design shown in FIG. 7 is useful in mounting the isolators 206. The washers 256 permit the vertical position of the ends of the isolators to be incrementally adjusted to ensure that these ends are appropriately positioned with respect to the adjacent bus bar segment. A second bracket 255 may be attached to the first bracket 254 in a manner which substantially electrically isolates the two brackets. By attaching the isolators to this second bracket 255, the electrical separation between the bus bar segments 210A-D and the isolators 206 may be maintained.

Although the conducting strip 214 of the conductor is desirably formed of a flexible, highly-conductive material, such as copper, most of the rest of the rest of the bus bar 210, as well as the bracket 254, is desirably formed of a temperature resistant material, such as zinc. As noted above, the cover 216 of the conductors 212 is desirably formed of an electrically insulative material; the cover may, for instance, be formed entirely of a temperature resistant plastic or may be formed generally of a flexible metal having an electrically insulative plastic coating. The electrically insulative properties of the cover prevent power applied to the conducting strip 214 to be conducted to the rest of the oven through the clamps 230.

In the discussion of the power delivery means 200, it was stated that in a preferred embodiment of the invention, each bus bar 210 comprised a plurality of individual bus bar segments 210 A–D. It was also stated that a separate isolator 206 may be disposed between adjacent bus bar segments. The construction of such a bus bar-isolator-bus bar junction is shown in FIG. 5, wherein the clamps 230 on the isolator 206 have been omitted for clarity.

The isolator 206 is preferably of substantially the same design as the bus bar 210, having a pair of parallel conductors 12 held adjacent one another by clamps 230. The bus bar segments 210 A and B are desirably considerably longer than the isolator 206, though. Each bus bar segment may, for example, be on the order of about 20 to about 30 feet long, whereas the isolators 206 may be only about one foot in length.

The brush 132 of the carrier's contact means should electrically contact the isolator 206 before it loses contact with the bus bar segment 210 as it proceeds along its testing path. Similarly, the brush 132 should contact the next bus bar segment 210B before moving out of contact with the isolator. This ensures that electrical power will be continuously supplied to the components without any interruption as the carrier encounters an isolator. Hence, an end of each conductor 212 of the isolator is located adjacent an end of a corresponding conductor of a bus bar segment. The space between the conductors of the isolator and the bus bar should be sufficient to electrically separate the two elements, i.e., to prevent arcing or similar difficulties, but should be no wider than the length of the fingers 134 of the carrier's contact means 130.

As explained above, the lower springs 146 urge the brush 132 of the contact means upwardly into engagement with the bus bar 210 and the isolator. It was also noted that the upper spring 144 biased the fingers 134 about the finger pivot 135 in a generally counterclockwise direction in FIG. 5. As the carrier moves along its testing path, i.e., to the left in FIG. 5, the forward ends of the fingers will extend into the space between the isolator 206 and an adjacent bus bar segment before the fingers entirely bridge this gap. Without the upper-spring 144, a finger may tend to pivot against the end of a conductor (e.g., the left end of a conductor of bus bar segment 210A), turning the finger's forward end upwardly into the aforementioned space. If this occurs, the forward end of the finger would abut the end of the next conductor (e.g., the right end of a conductor of the isolator 206) rather than gliding evenly across the space and contacting the conductor. The upper spring 144 substantially eliminates this problem by urging the fingers in a counterclockwise direction. This biases the rearward ends of the fingers toward a position above the forward ends, preventing the forward end from being raised above the rearward end into the space between the conductors.

The spacing of the carriers 100 should be different from, and is preferably greater than, the length of the isolators 206. If the distance between the contact means 130 of adjacent carriers was substantially the same as the length of the isolators, one carrier's contact means would be in contact with one bus bar segment, e.g., 210A, and an isolator 206 at the same time that another carrier's contact means was contacting the isolator and the next bus bar segment, e.g., 210B. This would electrically interconnect two adjacent bus bar segments through the isolator disposed between them. By appropriately spacing the carriers along the transport belt, though, this situation can be avoided, maintaining each bus bar segment's electrical independence from the other segments.

As discussed above in connection with FIG. 1, the carriers 100 may be continuously connected to the data management computer by means of connectors which travel with the carrier along its testing path. However, this requires a separate testing connection to be applied to each carrier 100, increasing the expense of the apparatus. Additionally, this testing connection would be subjected to repeated thermal cycling as it moves with the carrier from the cool zone 38 into the hot zone 36 of the oven cavity and back from the hot zone into the cool zone. Over time, this thermal cycling may have deleterious consequences for the testing apparatus.

Accordingly, in a preferred embodiment, separate testers 270 may be placed at different locations within the oven cavity 34. Desirably, one such tester (designated as the 'electrical lead tester' in FIG. 1), is permanently located in the cool zone adjacent the first electrical lead 202, as noted above. Once the power of the first electrical lead is ramped up, the tester 270 may be connected to the carrier and the behavior of the components on the carrier may be monitored. If any faulty components are detected, they may be removed through the component access port, and a new component may be place where the faulty component was located. The power supplied to the first electrical lead 202 is desirably ramped down before the unacceptable component is removed and ramped back up to testing voltage again after the new component is loaded on the carrier.

One or more testers 270 may also be located in the hot zone 36 of the oven cavity for testing the components at the elevated testing temperature, or at other locations within the oven cavity. In a preferred embodiment, such a tester is located in the hot zone near the buffer zone, as this permits testing of the component after the maximum dwell time at the elevated temperature.

Figure 8:
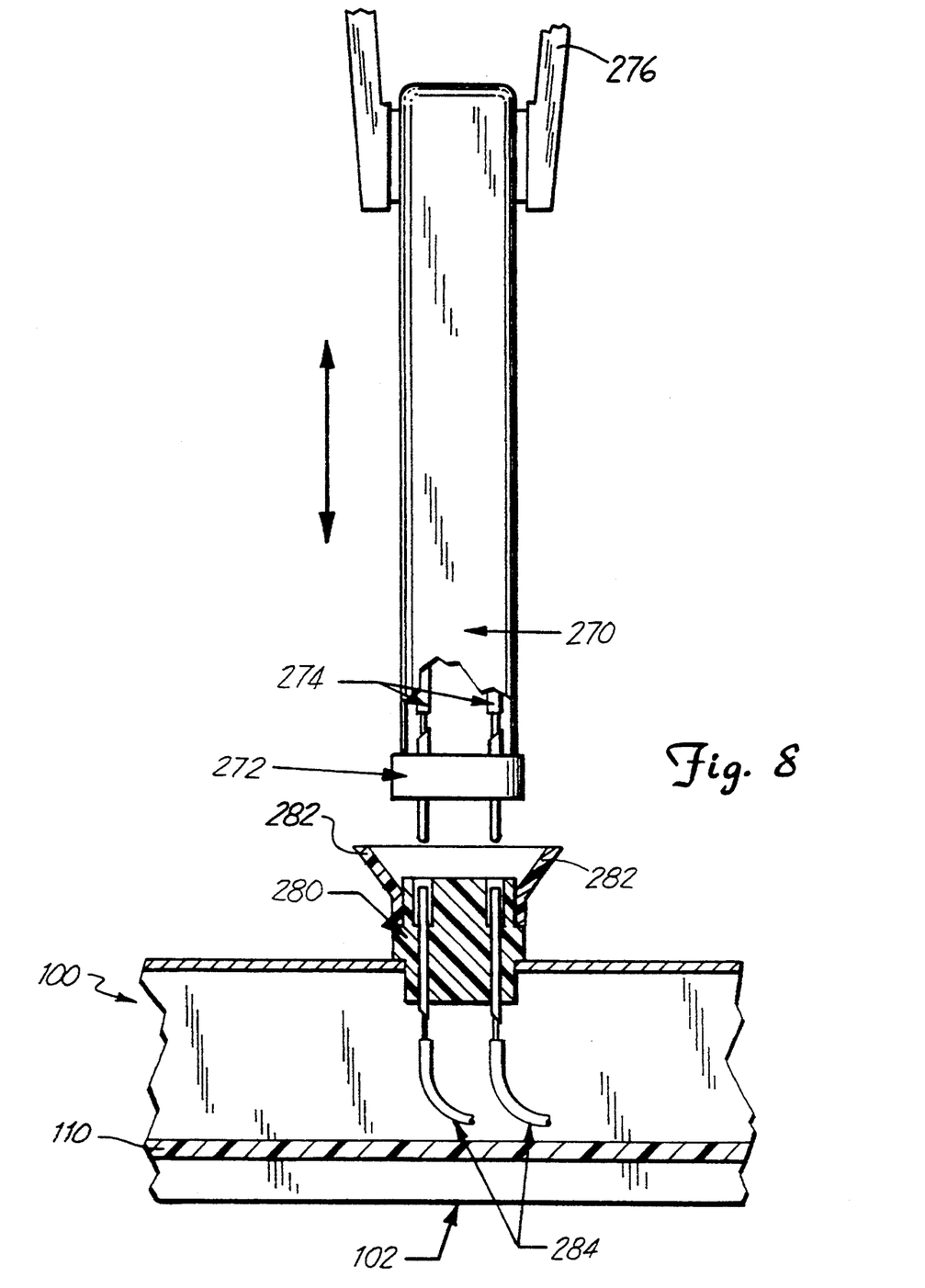
FIG. 8 is a cross-sectional view of a portion of the carrier of FIG. 3 depicting the attachment or removal of a testing module of a preferred embodiment of the invention.

Such a tester 270 is shown in FIG. 8. Adjacent one end, the tester may include a male plug 272. Wires 274 are attached at one end to the plug and may be attached at the other end to testing circuitry (not shown) carried within the tester 270. This circuitry communicates with the data management computer shown in FIG. 1. Alternatively, the wire 274 may lead from the plug to testing circuitry retained outside of the oven, such as the electrical lead tester and hot zone tester shown in FIG. 1, which in turn communicate with the data management computer.

The male plug 272 of the tester is shaped to mate with a female plug 280 on the carrier 100. The tester 270 is provided with a vertical actuating means 276 which may be permanently affixed to the tester for moving the male plug 272 into and out of engagement with the female plug 280 of the carrier. The female plug 280 may be provided with a guide 282 which extends generally upwardly and outwardly of the female plug 280 to assist in directing the male plug 272 into mating engagement with the female plug. This ensures that a proper connection will be made between the carrier 100 and the tester 270 despite slight differences in orientation of the carriers on the transport belt.

The tester 270 may remain in connection with a carrier 100 for any desired time. In a preferred embodiment, however, the connection is maintained for a time no greater than the time it takes to unload one set of components from the carrier and load a new set for testing. During this sequence, the carrier being unloaded and then loaded desirably remains stationary adjacent the carrier access port (60 in FIG. 3). The other carriers will, therefore, also remain in the same location during this time, because all of the carriers are attached to the same transport belt While a carrier remains stationary in a position adjacent one of the testers 270, the tester may be connected to the carrier, carry out the testing sequence, and be disconnected again. After the carrier adjacent the carrier access port has been loaded with a new set of components, the transport belt will be advanced so that the next carrier may be unloaded and loaded again. The tester may then be connected to the carrier adjacent the one previously tested.

Wires 284 are connected at one end to the female plug 280 and at the other end to the printed circuit board 110 of the carrier 100. Since each of the components 101 carried on the carrier 100 are electrically connected to this printed circuit board 110, this permits the tester 270 to communicate with the various components. During the time that the tester is connected to the carrier, the electronic testing of the components may be carried out by means known in the art. Broadly stated, this testing will generally comprise carrying out certain electronic functions which determine whether the behavior of each component is within certain prescribed limits. If the data received from any component is outside of these prescribed limits, the tester 270 may indicate to the data management computer that that particular component is unacceptable.

Figure 9:
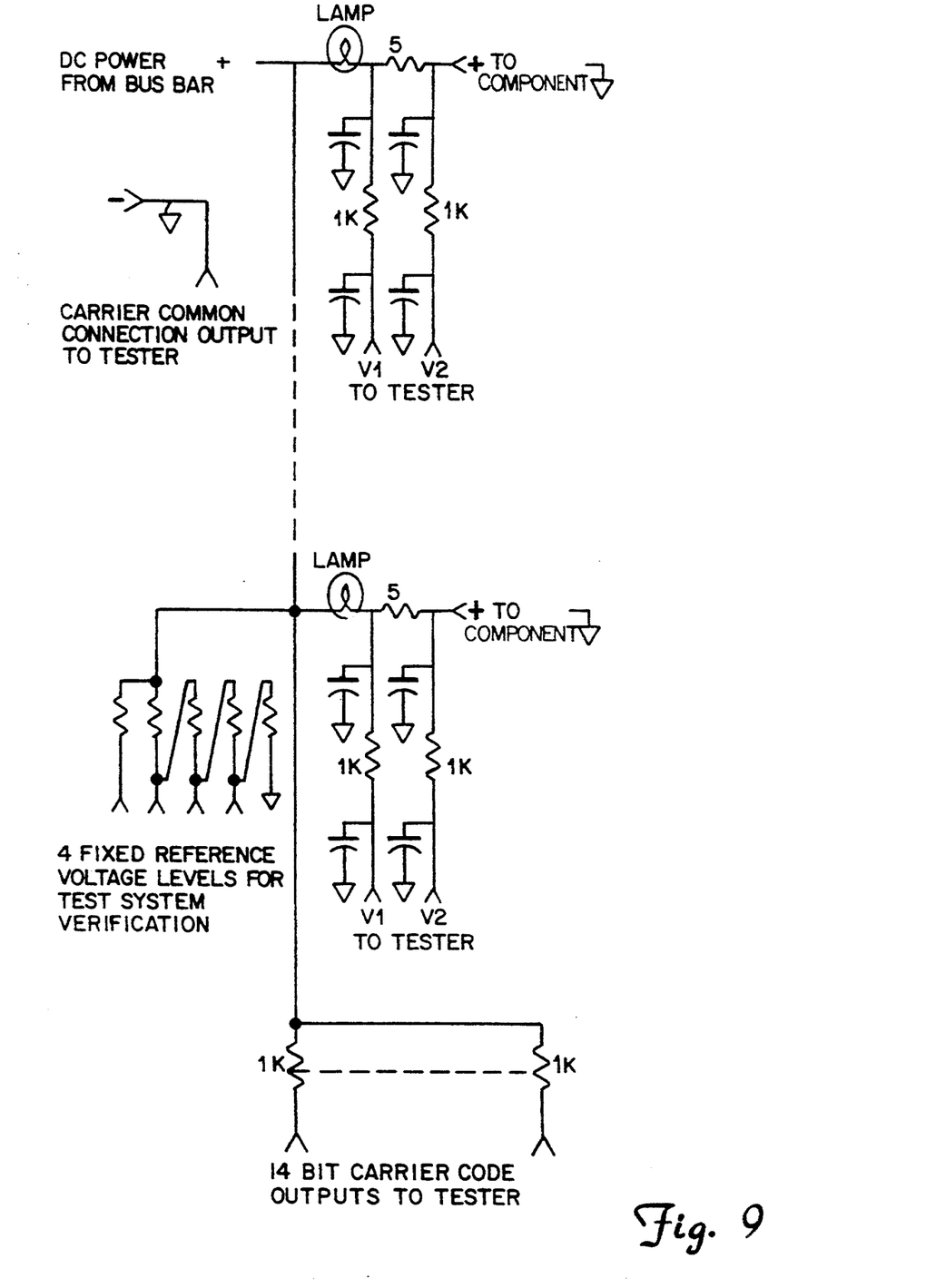
FIG. 9 is a schematic electrical diagram of a carrier of the invention.

The circuit shown in FIG. 9 sets forth a preferred embodiment of the wiring of the printed circuit board 110 of the component carrier. Although any number of components 101 may be connected to the carrier 100, the circuitry for connections to only two components are shown in this figure.

Power is transmitted to the printed circuit board from the bus bars via the contact means 130 of the component carrier. Each of the components is connected to a similar circuit, and each of these circuits is desirably connected in parallel to the other circuits. Each of these individual component circuits provides an output, designated as v1 and v2 in FIG. 9, which is connected to the female plug 280 of the carrier and in turn to the tester 270 via the male plug 272. Each of these outputs may be provided with a separate female port in the plug 280 which communicates with a separate mating portion of the male plug 272 of the tester.

Each of these separate component circuits may include a lamp, which may act as a current limiting device to protect the component attached to the circuit. In order to ensure reproducibility of the results, the printed circuit board may be provided with fixed voltage outputs which communicate with the tester; four such fixed references are shown in the circuit in FIG. 9.

As explained above in the discussion of FIG. 1, each component may be provided with a separate identification code. This code identifies which component is delivering test results to the data management center so that the particular components being tested may be pinpointed with accuracy. Also as noted above, this identification may be bar-code based and separate means may be provided for reading this bar code.

In the preferred embodiment shown in FIG. 9, though, the identification of the carrier is communicated directly to the tester 270 when it is connected to the carrier. This may be accomplished by providing each carrier with a 14-bit code which is provided by a number of resistors. The code portion of the circuit in FIG. 9 comprises 14 slots which are capable of receiving resistors; by providing resistors at only certain slots, a separate code may be created for each carrier. For instance, the presence of a resistor may indicate a "low" bit (represented digitally by a 0) and the lack of a resistor at a particular slot may indicate a "high" bit (represented digitally by a 1). In this manner, the 14-bit digital code of 1's and 0's may be created for each carrier.

While a preferred embodiment of the present invention has been described, it should be understood that various changes, adaptations and modifications may be made therein without departing from the spirit of the invention and the scope of the appended claims.

We claim:

1. An electronic component testing apparatus comprising:
    an endless movable transport belt;
    at least one carrier attached to the transport belt for releasably retaining at least one electronic component;
    a pair of electrical bus bars operatively connected to an electrical power supply, the bus bars having first and second ends and being positioned adjacent the transport belt and extending along a portion of the transport belt;
    a first pair of electrical leads operatively connected to an electrical power supply, the leads being located adjacent the transport belt, one of the electrical leads being disposed adjacent the first end of each of the electrical bus bars;
    a first means for controlling the power delivered from the electrical power supply to the first pair of electrical leads, the first means being capable of ramping up the electrical potential between the electrical leads from an initial low voltage to a second voltage substantially equal to the voltage applied to the electrical bus bars;
    contact means attached to the carrier for travelling along and electrically contacting the electrical bus bars and for electrically contacting the first pair of electrical leads, said contact means being electrically connectable to an electronic component retained by the carrier;
    a housing defining a cavity through which at least a portion of the movable transport belt passes; and
    means for maintaining the ambient environment within a portion of the cavity at an elevated temperature.

2. The apparatus of claim 1 further comprising at least two power supplies, said bus bars being connected to a first of the power supplies and said electrical leads being connected to a second of the power supplies.

3. The testing apparatus of claim 2 further comprising:
   a third power supply;
   a second pair of electrical leads located adjacent the transport belt, with one of the leads of the second pair disposed adjacent the second end of each of the electrical bus bars, the contact means of the carrier being electrically contactable with the second pair of electrical leads; and
   a second means for controlling the power delivered from the third power supply to the second pair of electrical leads, the second means being capable of ramping down the electrical potential between the electrical leads from an initial voltage substantially equal to the voltage applied to the electrical bus bars to a final low voltage.

4. The apparatus of claim 1, wherein each one of the paired electrical bus bars comprises two parallel conductors positioned adjacent one another, with both conductors having substantially the same potential.

5. The apparatus of claim 1, wherein the electrical bus bars comprise at least two independently powered segments of the paired bus bars.

6. The apparatus of claim 5, wherein each bus bar segment is operatively connected to a separate electrical power supply.

7. The apparatus of claim 5, wherein the electrical bus bars further comprise an isolator disposed between adjacent ends of adjoining bus bar segments, the isolator being electrically isolated from the bus bar segments.

8. The apparatus of claim 7, wherein the isolators are all operatively connected to a single electrical power supply which delivers power only to the isolators.

9. The apparatus of claim 7, wherein the electrical bus bar segments and the isolators are all maintained at substantially the same voltage.

10. The apparatus of claim 7, wherein the contact means of each carrier is shaped to contact and electrically connect an isolator and a bus bar segment simultaneously when the carrier is located adjacent this junction, the carriers being so spaced along the transport belt that when the contact means of one carrier is so positioned, each isolator is electrically connected to only one bus bar segment.

11. The apparatus of claim 1 wherein the contact means of each carrier is shaped to remain in electrical contact with the first pair of electrical leads until after the contact means electrically contacts the bus bars as the carrier moves from a position adjacent the first pair of leads to a position adjacent the bus bars.

12. The apparatus of claim 1 wherein the housing comprises a heating zone wherein the ambient environment is maintained at an elevated temperature and a cooling zone wherein the ambient temperature is lower than the temperature in the heating zone, and a buffer zone wherein the ambient temperature is intermediate the heating zone's temperature and the cooling zone's temperature.

13. The apparatus of claim 12 further comprising temperature control means for maintaining a substantially constant temperature within the heating zone.

14. The apparatus of claim 12 wherein the first and second ends of the bus bars are located adjacent the cooling zone and most of the length of the bus bars extends through the heating zone.

15. The apparatus of claim 1 further comprising means for monitoring the behavior of the electrical component.

16. The apparatus of claim 15 wherein said monitoring means is capable of indicating failure of the component if the behavior of the component unacceptably deviates from standard behavior for such a component.

17. The apparatus of claim 1 wherein said carrier comprises at least one slot for releasably retaining an electronic component, and a retaining bar adapted to engage an electronic component at a position generally opposite its connection to the slot to restrict relative movement between the slot and an electronic component retained therein.

18. The apparatus of claim 12 wherein the heating zone is disposed generally above the cooling zone and the buffer zone is disposed between the heating zone and the cooling zone.

19. The apparatus of claim 1 wherein the cavity defined by the housing includes a heating zone wherein the ambient environment is maintained at an elevated temperature and a cooling zone wherein the ambient temperature is lower than the temperature in the heating zone, the heating zone being disposed generally above the cooling zone.

* * * * *